(12) United States Patent
Yang et al.

(10) Patent No.: US 11,204,402 B2
(45) Date of Patent: Dec. 21, 2021

(54) MINIMIZING COUPLING IN MULTI-ROW CYLINDRICAL-SHAPED MAGNETIC RESONANCE IMAGING (MRI) RADIO FREQUENCY (RF) COIL

(71) Applicant: Quality Electrodynamics, LLC, Mayfield Village, OH (US)

(72) Inventors: Xiaoyu Yang, Indiana, PA (US); Tsinghua Zheng, Chesterland, OH (US); Haoqin Zhu, Mayfield Village, OH (US)

(73) Assignee: Quality Electrodynamics, LLC, Mayfield Village, OH (US)

( * ) Notice: Subject to any disclaimer, the term of this patent is extended or adjusted under 35 U.S.C. 154(b) by 0 days.

(21) Appl. No.: 16/816,492

(22) Filed: Mar. 12, 2020

(65) Prior Publication Data
US 2020/0292643 A1 Sep. 17, 2020

Related U.S. Application Data

(60) Provisional application No. 62/817,040, filed on Mar. 12, 2019.

(51) Int. Cl.
*G01R 33/3415* (2006.01)
*G01R 33/36* (2006.01)
*G01R 33/34* (2006.01)

(52) U.S. Cl.
CPC ... *G01R 33/3415* (2013.01); *G01R 33/34007* (2013.01); *G01R 33/365* (2013.01); *G01R 33/3635* (2013.01)

(58) Field of Classification Search
CPC ......... G01R 33/34007; G01R 33/3635; G01R 33/365; G01R 33/3415
See application file for complete search history.

(56) References Cited

U.S. PATENT DOCUMENTS

| 4,825,162 | A | * | 4/1989 | Roemer | G01R 33/3415 324/312 |
| 5,144,240 | A | * | 9/1992 | Mehdizadeh | G01R 33/34046 324/318 |
| 7,091,721 | B2 | | 8/2006 | Jevtic | |
| 7,253,622 | B2 | * | 8/2007 | Saylor | G01R 33/34046 324/318 |

(Continued)

OTHER PUBLICATIONS

Wang, Jianmin."A Novel Method to Reduce the Signal Coupling of Surface Coils for MRI."Proc. ISMRM 4:1434 (1996).

*Primary Examiner* — Dixomara Vargas
(74) *Attorney, Agent, or Firm* — Eschweiler & Potashnik, LLC

(57) ABSTRACT

Embodiments relate to cylindrical MRI coil arrays with reduced coupling between coil elements. One example embodiment comprises two or more rows, wherein each row comprises at least three RF coil elements of that row enclosing a cylindrical axis; and a ring comprising an associated portion of each RF coil element of a first row and a second row electrically connected together, wherein the associated portion of each RF coil element of the first row and of each RF coil element of the second row comprises an associated capacitor of that RF coil element, and wherein the associated capacitor of that RF coil element is configured to reduce coupling among the RF coil elements of the first row and the RF coil elements of the second row.

20 Claims, 10 Drawing Sheets

(56) References Cited

U.S. PATENT DOCUMENTS

| | | | | |
|---|---|---|---|---|
| 8,742,759 | B2* | 6/2014 | Soutome | G01R 33/365 324/318 |
| 9,585,595 | B2* | 3/2017 | Xu | G01R 33/3415 |
| 10,386,430 | B2* | 8/2019 | Yang | G01R 33/3642 |
| 2004/0140808 | A1* | 7/2004 | Vaughan, Jr. | G01R 33/5659 324/318 |
| 2006/0033497 | A1* | 2/2006 | Chmielewski | G01R 33/34046 324/318 |
| 2006/0033501 | A1* | 2/2006 | Vaughan, Jr. | G01R 33/34046 324/322 |
| 2006/0173284 | A1* | 8/2006 | Ackerman | G01R 33/34046 600/422 |
| 2007/0007964 | A1* | 1/2007 | Vaughan, Jr. | G01R 33/3635 324/322 |
| 2007/0247160 | A1* | 10/2007 | Vaughan, Jr. | G01R 33/3453 324/322 |
| 2008/0024133 | A1* | 1/2008 | Vaughan | G01R 33/3453 324/318 |
| 2008/0278167 | A1* | 11/2008 | Vaughan, Jr. | G01R 33/345 324/318 |
| 2008/0284436 | A1* | 11/2008 | Weizenecker | G01R 33/3415 324/318 |
| 2009/0021256 | A1* | 1/2009 | Soutome | G01R 33/34046 324/318 |
| 2009/0096553 | A1* | 4/2009 | Driesel | G01R 33/345 333/219 |
| 2010/0213941 | A1* | 8/2010 | Driesel | G01R 33/3415 324/322 |
| 2011/0121834 | A1* | 5/2011 | Soutome | G01R 33/365 324/318 |
| 2012/0112748 | A1* | 5/2012 | Hetherington | G01R 33/3635 324/318 |
| 2012/0169340 | A1* | 7/2012 | Leussler | G01R 33/345 324/309 |
| 2013/0184566 | A1* | 7/2013 | Kreischer | G01R 33/34084 600/422 |
| 2014/0055136 | A1* | 2/2014 | Leussler | G01R 33/3415 324/309 |
| 2014/0333305 | A1* | 11/2014 | Xu | G01R 33/365 324/322 |
| 2015/0123660 | A1* | 5/2015 | Vaughan, Jr. | G01R 33/54 324/314 |
| 2018/0081005 | A1* | 3/2018 | Yang | G01R 33/3628 |
| 2018/0081008 | A1* | 3/2018 | Yang | G01R 33/34046 |
| 2018/0275226 | A1* | 9/2018 | Yang | A61B 5/06 |
| 2018/0275233 | A1* | 9/2018 | Yang | G01R 33/34046 |
| 2018/0313918 | A1* | 11/2018 | Yang | G01R 33/34007 |
| 2018/0321339 | A1* | 11/2018 | Yang | G01R 33/3415 |
| 2018/0364318 | A1* | 12/2018 | Yang | G01R 33/3628 |
| 2019/0154775 | A1* | 5/2019 | Stack | G01R 33/34007 |
| 2019/0257898 | A1* | 8/2019 | Yang | G01R 33/3614 |
| 2019/0310328 | A1* | 10/2019 | Fuqua | G01R 33/3685 |
| 2019/0369176 | A1* | 12/2019 | Dalveren | G01R 33/34084 |
| 2020/0278405 | A1* | 9/2020 | Yang | G01R 33/3685 |
| 2020/0292643 | A1* | 9/2020 | Yang | G01R 33/365 |

* cited by examiner

MINIMIZING COUPLING IN MULTI-ROW CYLINDRICAL-SHAPED MAGNETIC RESONANCE IMAGING (MRI) RADIO FREQUENCY (RF) COIL

REFERENCE TO RELATED APPLICATIONS

This application claims the benefit of U.S. Provisional Patent Application No. 62/817,040 filed Mar. 12, 2019, entitled "MINIMIZING COUPLING IN MULTI-ROW CYLINDRICAL-SHAPED MAGNETIC RESONANCE IMAGING (MRI) RADIO FREQUENCY (RF) COIL", the contents of which are herein incorporated by reference in their entirety.

BACKGROUND

Magnetic resonance imaging (MRI) involves the transmission and receipt of radio frequency (RF) energy. RF energy can be transmitted by a coil. Resulting magnetic resonance (MR) signals can also be received by a coil. In early MRI, RF energy may have been transmitted from a single coil and resulting MR signals received by a single coil. Later, multiple receivers may have been used in parallel acquisition techniques. Similarly, multiple transmitters may have been used in parallel transmission (pTx) techniques.

RF coils can create the Bi field that rotates the net magnetization in a pulse sequence. RF coils can also detect precessing transverse magnetization. Thus, RF coils can be transmit (Tx) coils, receive (Rx) coils, or transmit and receive (Tx/Rx) coils. An imaging coil should be able to resonate at a selected Larmor frequency. Imaging coils include inductive elements and capacitive elements. The inductive elements and capacitive elements have been implemented according to existing approaches using two terminal passive components (e.g., capacitors). The resonant frequency, f, of a RF coil is determined by the inductance (L) and capacitance (C) of the inductor capacitor circuit according to equation (1):

$$f = \frac{1}{2\pi\sqrt{LC}} \quad (1)$$

Imaging coils may need to be tuned. Tuning an imaging coil may include varying the value of a capacitor. Recall that frequency: $f=\omega/(2\pi)$, wavelength in vacuum: $\lambda=c/f$, and $\lambda=4.7$ m at 1.5 T. Recall also that the Larmor frequency: $f_0=\gamma B_0/(2\pi)$, where (for $^1H$ nuclei) $\gamma/(2\pi)=42.58$ MHz/T; at 1.5 T, $f_0=63.87$ MHz; at 3 T, $f_0=127.73$ MHz; at 7 T, $f_0=298.06$ MHz. Basic circuit design principles include the fact that capacitors add in parallel (impedance $1/(jC\omega)$) and inductors add in series (impedance $jL\omega$).

DETAILED DESCRIPTION

Figure 1:
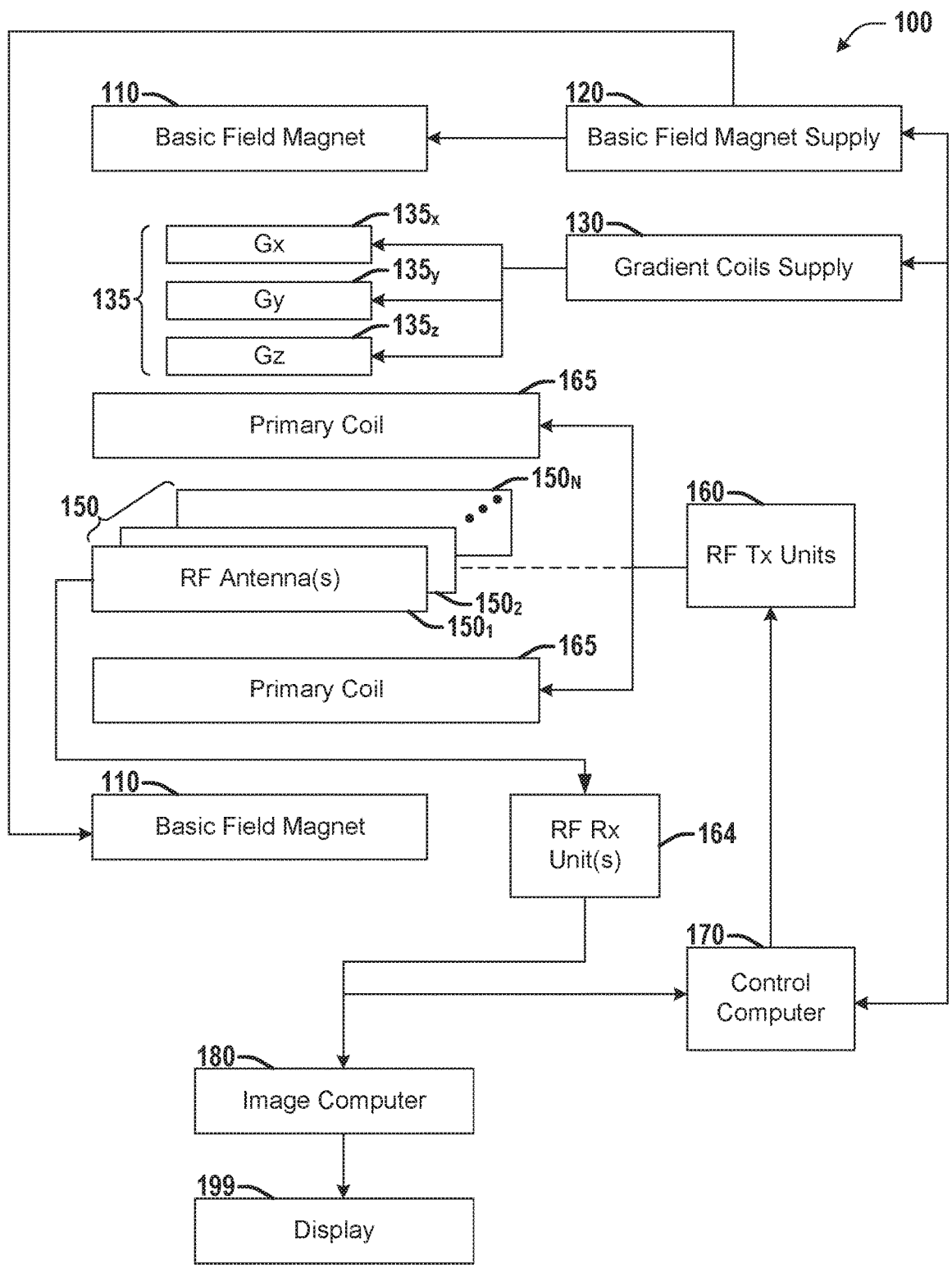
FIG. 1 is a block diagram illustrating an example MRI (Magnetic Resonance Imaging) apparatus that can be configured with example MRI RF (Radio Frequency) coils, coil elements, coil arrays, or circuitry according to one or more embodiments described herein.

The present disclosure will now be described with reference to the attached drawing figures, wherein like reference numerals are used to refer to like elements throughout, and wherein the illustrated structures and devices are not necessarily drawn to scale.

Embodiments described herein can be implemented in a MRI (Magnetic Resonance Imaging) system using any suitably configured hardware and/or software. Referring to FIG. 1, illustrated is an example MRI apparatus 100 that can be configured with example MRI RF coils, coil elements, coil arrays, or circuitry according to one or more embodiments described herein. Apparatus 100 includes basic field magnet(s) 110 and a basic field magnet supply 120. Ideally, the basic field magnets 110 would produce a uniform $B_0$ field. However, in practice, the $B_0$ field may not be uniform, and may vary over an object being imaged by the MRI apparatus 100. MRI apparatus 100 can include gradient coils 135 configured to emit gradient magnetic fields like $G_x$ (e.g., via an associated gradient coil $135_x$), $G_y$ (e.g., via an associated gradient coil $135_y$) and $G_z$ (e.g., via an associated gradient coil $135_z$). The gradient coils 135 can be controlled, at least in part, by a gradient coils supply 130. In some examples, the timing, strength, and orientation of the gradient magnetic fields can be controlled, and thus selectively adapted during a MRI procedure.

MRI apparatus 100 can include a primary coil 165 configured to generate RF pulses. The primary coil 165 can be a whole body coil (WBC). The primary coil 165 can be, for example, a birdcage coil. The primary coil 165 can be controlled, at least in part, by a RF transmission unit 160. RF transmission unit 160 can provide a signal to primary coil 165.

MRI apparatus 100 can include a set of RF antennas 150 (e.g., one or more RF antennas $150_1$-$150_N$, which can be as described herein). RF antennas 150 can be configured to generate RF pulses and/or to receive resulting magnetic resonance signals from an object to which the RF pulses are directed. A RF antenna 150 configured solely to generate RF pulses can be referred to herein as a transmit (or Tx) antenna (or coil or coil array), while a RF antenna 150 configured solely to receive resulting magnetic resonance signals from an object to which the RF pulses are directed can be referred to herein as a receive (or Rx) antenna (or coil or coil array), and a RF antenna 150 configured to both generate RF pulses and receive resulting magnetic resonance signals can be referred to herein as a transmit/receive (or Tx/Rx) antenna (or coil or coil array). Unless otherwise indicated, antennas, coils, and coil arrays discussed herein can, in various embodiments, be any of a Tx antenna/coil/coil array, a Rx antenna/coil/coil array, or a Tx/Rx antenna/coil/coil array.

In some embodiments, RF antennas 150 can be configured to inductively couple with primary coil 165 and generate RF pulses and to receive resulting magnetic resonance signals from an object to which the RF pulses are directed. In other embodiments, RF antennas 150 can be electrically coupled to a RF power source (e.g., RF Tx unit 160) that can drive RF antennas 150 to generate RF pulses, and RF antennas can also be configured to receive resulting magnetic resonance signals from an object to which the RF pulses are directed. In one embodiment, one or more members of the set of RF antennas 150 can be fabricated from flexible coaxial cable, or other conductive material. The set of RF antennas 150 can be connected with a RF receive unit 164.

The gradient coils supply 130 and the RF transmission units 160 can be controlled, at least in part, by a control computer 170. The magnetic resonance signals received from the set of RF antennas 150 can be employed to generate an image, and thus can be subject to a transformation process like a two-dimensional fast Fourier transform (FFT) that generates pixilated image data. The transformation can be performed by an image computer 180 or other similar processing device. The image data can then be shown on a display 199. RF Rx Units 164 can be connected with control computer 170 or image computer 180. While FIG. 1 illustrates an example MRI apparatus 100 that includes various components connected in various ways, it is to be appreciated that other MRI apparatus can include other components connected in other ways, and can be employed in connection with various embodiments discussed herein.

In one embodiment, MRI apparatus 100 includes control computer 170. In one example, a member of the set of RF antennas 150 can be individually controllable by the control computer 170. A member of the set of RF antennas 150 can be an example MRI RF coil array including, for example, MRI RF coil arrays as described herein. In various embodiments, the set of RF antennas 150 can include various combinations of example embodiments of MRI RF coil arrays, elements or example embodiments of MRF RF coil arrays, including single-layer MRI RF coil elements or single-layer MRI RF coil arrays, according to various embodiments described herein.

A MRI apparatus can include, among other components, a controller (e.g., control computer 170) and a RF coil (e.g., primary coil 165) operably connected to the controller. The controller can provide the RF coil with a current, a voltage, or a control signal. The coil can be a whole body coil. The coil can inductively couple with an example MRI RF coil element, or MRI RF coil array, as described herein. Control computer 170 can provide a DC bias current, or control a DC bias control circuit to control the application of a DC bias current to MRI RF coil arrays or elements that can be part of antennas 150.

Phase array technology is one existing approach for building a multiple-channel MR coil. Phase array technology provides the advantages of large-coil-like signal penetration with the high signal performance of a small coil at shallow depth. The minimum isolation between direct neighbors can be achieved by overlapping coils for minimized mutual inductance. Coupling between non-direct neighbors can be minimized by the low input impedance preamplifier. However, even with the preamplifier decoupling, the isolations between coil elements without preamplifiers are important for SNR (signal-to-noise ratio). Thus, it can be advantageous to optimize the coil element isolation as well as possible. In addition to the overlap approach to isolation discussed above (which is one kind of transformer approach), a capacitor can be used to achieve isolation between two coil elements. Some existing systems use a capacitor ladder network to isolate as many as nine loops.

However, if there is a large number of channels (e.g., more than 12, etc.), and the channels cover a cylindrical like anatomy with multiple rows (e.g., two or more rows), it is very difficult to use the aforementioned approaches to isolate all channels because the number of coil pairs is too many. As an illustrative example, for a coil that comprises three rows where each row has 8 channels, then the total number of pairs of channels is 24×23/2=276. Overlap can be used to decouple direct neighbors (e.g., in the 3 row, 24 coil element example, this can account for 56 couplings of the 276 in the example coil, if rows are aligned such that each element partially overlaps two elements of each adjacent row). Additionally, the coupling between two distant coil elements can be ignored because it is intrinsically small (e.g., in the 3 row, 24 coil element example, this can account for 64 couplings of the 276 in the example coil). However, for a cylindrical shaped coil with multiple rows, the coupling between non-direct neighbors in the same row and the coupling between non-direct neighbors between two adjacent rows are still quite large. The total number of these large couplings can easily become a very high number. For example, for the 3 row, 24 coil element example, one element in the middle row can have large couplings to 5 elements in the middle row and 6 elements each for two neighboring rows. The total number of large couplings with non-adjacent coil elements is 5+6+6=17 for that one coil element, and 156 among all of the 24 coil elements. It is not practical to decouple this many couplings between coil elements using any of transformers, capacitors or a capacitor ladder network. However, in various embodiments, techniques discussed herein can be employed that can minimize all of the couplings as a whole (e.g., via a decoupling ring as discussed herein), instead of decoupling individual pairs of coil elements.

Figure 2:
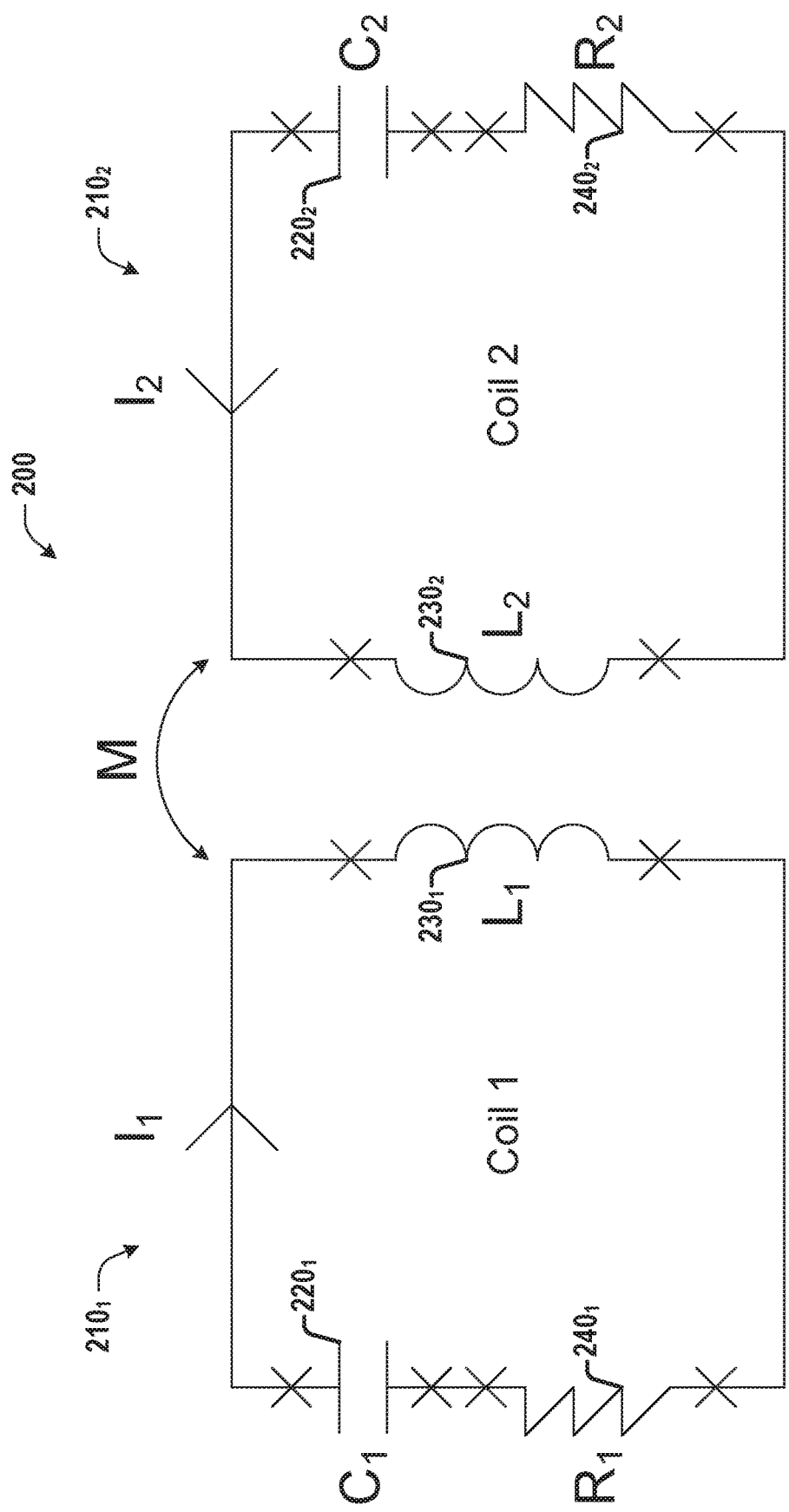
FIG. 2 is a diagram illustrating a circuit diagram of two coils coupled to each other with mutual inductance, in connection with various aspects discussed herein.

Techniques discussed herein and employed by various embodiments can be better understood by consideration of an example of two RF coil elements coupling to each other through mutual inductance. Referring to FIG. 2, illustrated is a circuit diagram 200 showing two coils $210_1$ and $210_2$ coupled to each other with mutual inductance, in connection with various aspects discussed herein. Coil $210_1$ (coil 1) comprises inductor $230_1$ (with inductance $L_1$), capacitor $220_1$ (with capacitance $C_1$) and resistor $240_1$ (with resistance $R_1$) where $L_1$ is the inductance of the coil trace inductor, $C_1$ is the equivalent capacitance of the breaking point capacitor(s), and $R_1$ is the coil loss which includes the copper loss, phantom/patient loss, and RF radiation loss. Corresponding definitions apply to coil $210_2$ (coil 2), inductor $230_2$ (and inductance $L_2$), capacitor $220_2$ (and capacitance $C_2$) and resistor $240_2$ (and resistance $R_2$). The mutual inductance between two coils is represented by M in FIG. 2. For simplicity, the matching circuit and other supporting circuits for RF coil elements $210_1$ and $210_2$ are not shown in FIG. 2. The circuit in FIG. 2 can represent receive (Rx) coils, transmit (Tx) coils, or Tx/Rx coils. Applying Kirchhoff's law to the circuit of FIG. 2 gives equations (2):

$$\begin{cases} I_1\left(j\omega L_1 - j\frac{1}{\omega C_1} + R_1\right) + j\omega M I_2 = 0 \\ I_2\left(j\omega L_2 - j\frac{1}{\omega C_2} + R_2\right) + j\omega M I_1 = 0 \end{cases} \quad (2)$$

where ω is the angular frequency. Defining $I_0=I_1+I_2$, equations (2) can be re-written as equations (3):

$$\begin{cases} I_1\left(j\omega L_1 - j\omega M - j\frac{1}{\omega C_1} + R_1\right) + j\omega M(I_1 + I_2) = 0 \\ I_2\left(j\omega L_2 - j\omega M - j\frac{1}{\omega C_2} + R_2\right) + j\omega M(I_1 + I_2) = 0 \end{cases} \quad (3)$$

Figure 3:
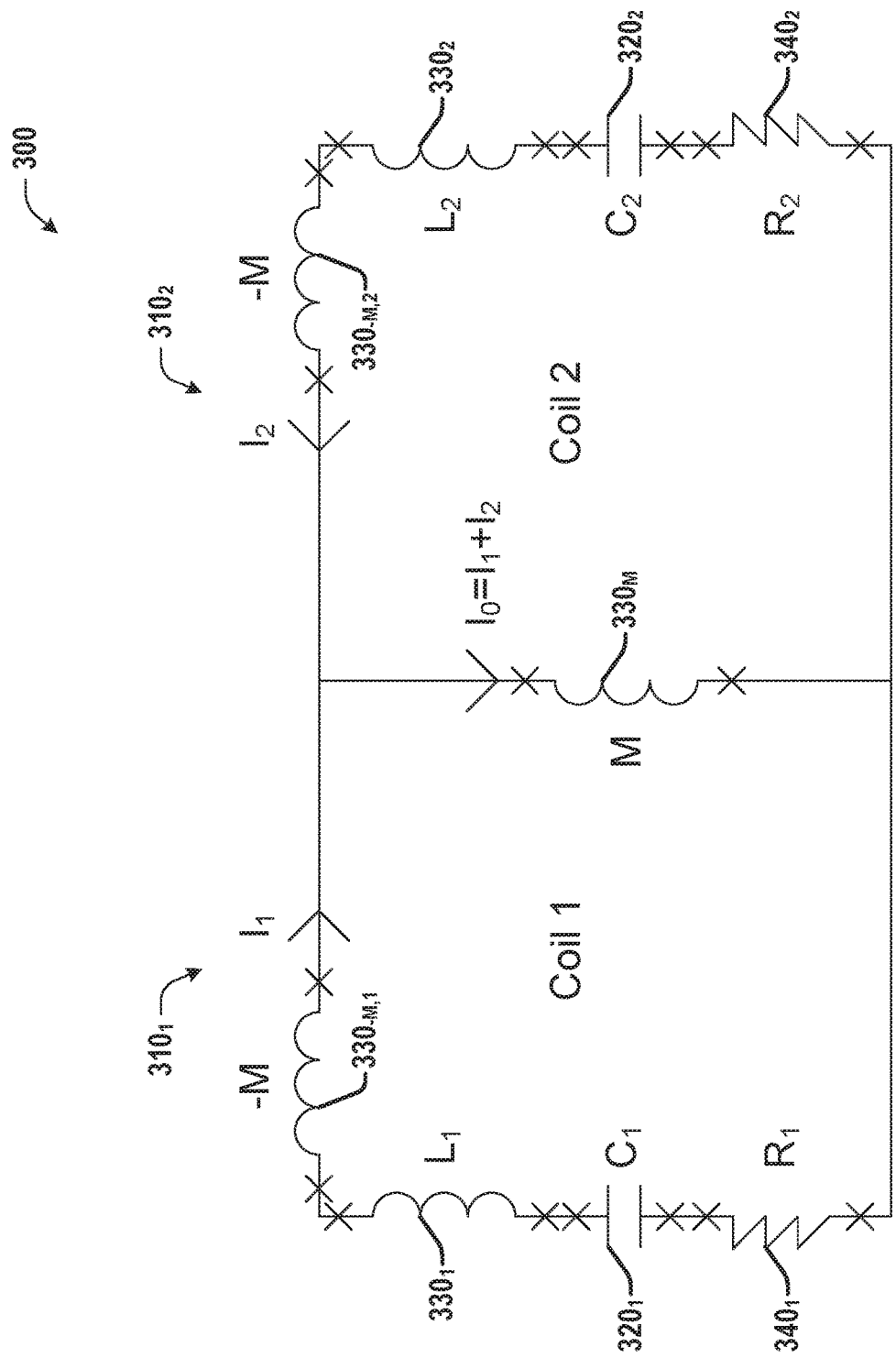
FIG. 3 is a diagram illustrating an equivalent circuit diagram to FIG. 2, redrawn with the two coils as a single electrically connected circuit, in connection with various aspects discussed herein.

Based on equations (3), FIG. 2 can be redrawn. Referring to FIG. 3, illustrated is an equivalent circuit diagram 300 to FIG. 2, redrawn with the two coils $310_1$ and $310_2$ as a single electrically connected circuit, in connection with various aspects discussed herein.

The representation of FIG. 3 provides additional insights over FIG. 2. In FIG. 3, the mutual inductance M is shown as a shared reactance $330_M$ to cause the coupling (additionally, in the equivalent diagram of FIG. 3, coil $210_1$ also comprises reactance $330_{-M,1}$ and coil $210_1$ also comprises reactance $330_{-M,1}$, both with inductance −M).

Figure 4:
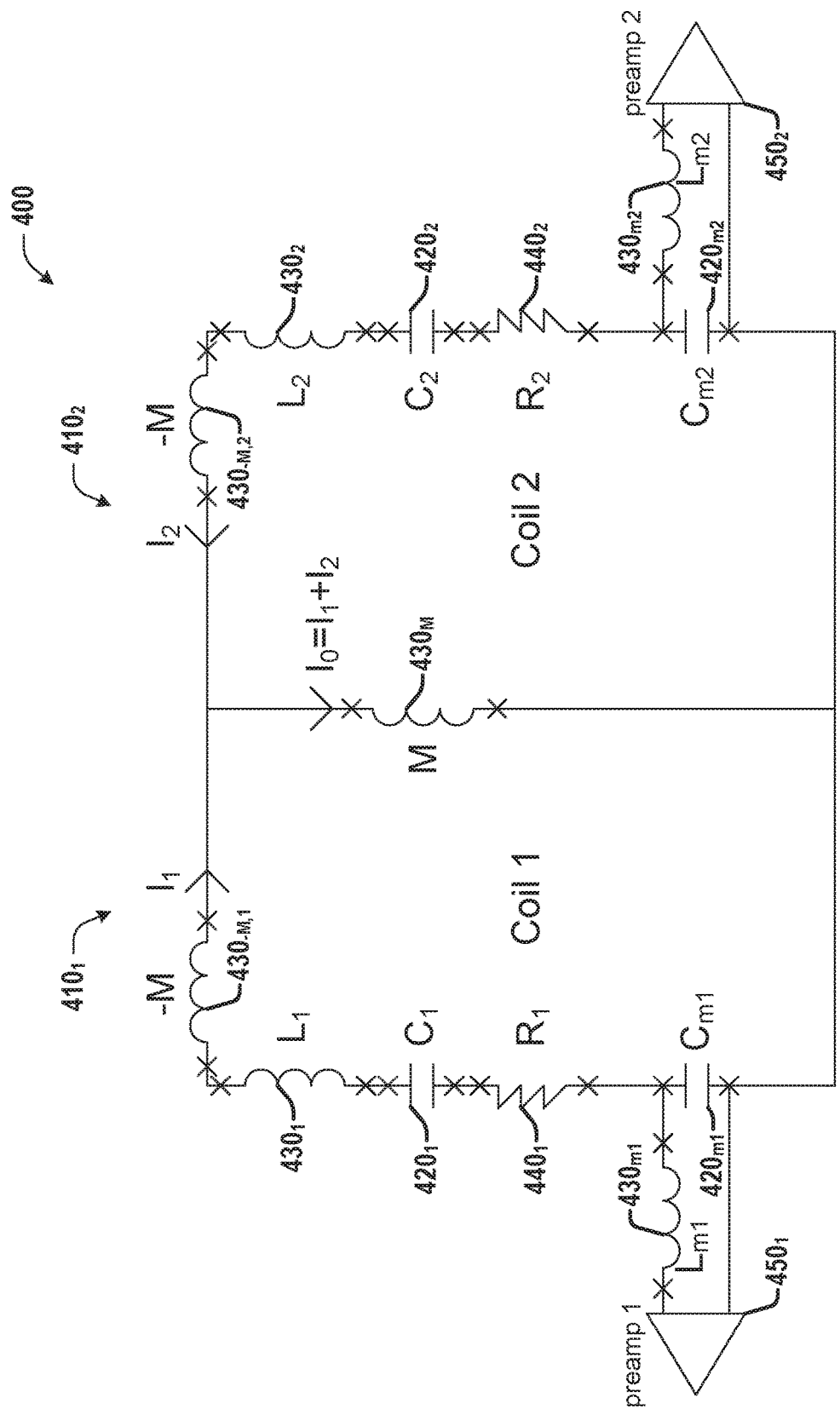
FIG. 4 is a diagram illustrating an equivalent circuit diagram of two inductively coupled coils with preamplifier decoupling, in connection with various aspects discussed herein.

In the next situation that is considered, this M is not minimized using overlap (e.g., because coil 1 and coil 2 are not direct neighbors, etc.) and preamplifier decoupling is used. Referring to FIG. 4, illustrated is an equivalent circuit diagram 400 of two inductively coupled coils $410_1$ and $410_2$ with preamplifier decoupling, in connection with various aspects discussed herein. In FIG. 4, preamplifiers $450_i$ are connected to coils $410_i$ across a matching capacitor $420_{mi}$, and with a matching inductor $430_{mi}$ at one of the inputs of preamplifier $450_i$. However, in some scenarios, matching capacitors $420_{mi}$ can be replaced with inductors, and matching inductors $430_{mi}$ can be replaced with capacitors. Additionally, it is to be appreciated that this is just one example arrangement of circuit elements that can be employed for connecting preamplifier $450_i$ to coil element $410_i$ (e.g., PIN diodes can be included to decouple preamplifier $450_i$ in a Tx mode).

In general, $R_1$ (of $440_1$) and $R_2$ (of $440_2$) are at the level of single digit Ohms or less. At the resonant frequency, inductor $430_i$ (with inductance $L_i$) and capacitor $420_i$ (with capacitance $C_i$) resonate with each other. Thus, their impedances cancel each other. Since preamplifier $450_i$ has low input impedance and matching capacitor $420_{mi}$ (with capacitance Cm) and with a matching inductor $430_{mi}$ (with inductance Lm) resonate with each other, the impedance across matching capacitor $420_{mi}$ is high. The impedance across matching capacitor $420_{mi}$ can be much larger than $R_2$ and can possibly be greater than jωM. For ease of discussion, it is assumed that the impedance across matching capacitor $420_{mi}$ is dominant, and is referred to herein as $Rpre_i$.

Figure 5:
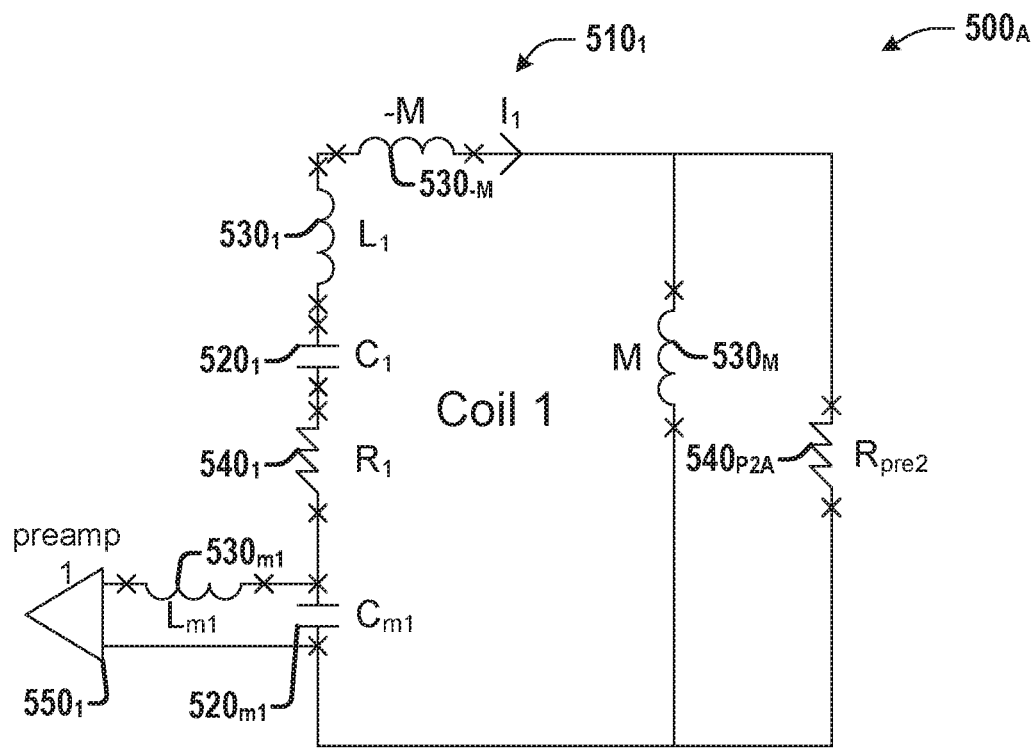
FIG. 5 is a diagram illustrating a pair of equivalent circuit diagrams to the circuit diagram of FIG. 4, replacing the second coil with an equivalent resistance from imperfect preamplifier coupling in parallel across the loop (top diagram) and in the loop (bottom diagram), in connection with various aspects discussed herein.
Figure 5:
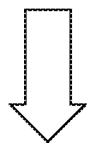
Figure 5:
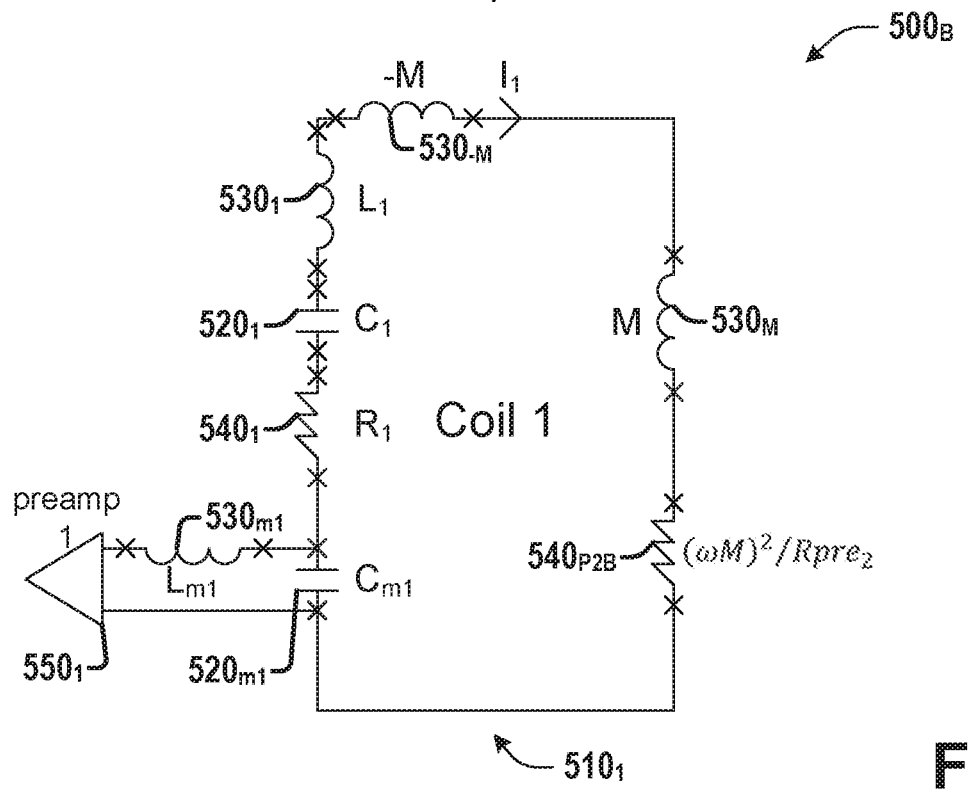

Referring to FIG. 5, illustrated is a pair of equivalent circuit diagrams $500_A$ and $500_B$ to the circuit diagram of FIG. 4, replacing coil 2 (not shown) with an equivalent resistance from imperfect preamplifier coupling in parallel across the loop (top diagram $500_A$ and resistance $540_{P2A}$) and in the loop (bottom diagram $500_B$ and resistance $540_{P2B}$), in connection with various aspects discussed herein. The mutual inductance M (represented by inductor $530_M$, etc.) will convert the preamplifier decoupling impedance Rpre (represented by resistor $540_{P2A}$) as a small coil resistor $540_{P2B}$ (ωM)²/Rpre for the other coil (e.g., for coil $510_1$ as shown at $500_B$). If the decoupling of preamplifier $550_1$ is perfect (and thus Rpre2 is infinite), then the small coil resistor $540_{P2B}$ from the mutual inductance has a resistance of zero and there is no SNR impact to the other coil ($510_1$). However, preamplifier decoupling is never perfect, and thus Rpre2 is finite. As a result, the coil noise for coil 1 ($510_1$) will increase from $\sim\sqrt{R_1}$ to $\sim\sqrt{R_1+(\omega M)^2/Rpre_2}$. In other words, the noise in coil 1 noise increases slightly as a result of mutual inductance and imperfect preamplifier decoupling. Referring again to FIG. 4, it can be seen in this representation that one way to decouple coil 1 and coil 2 would be by using a capacitor.

Figure 6:
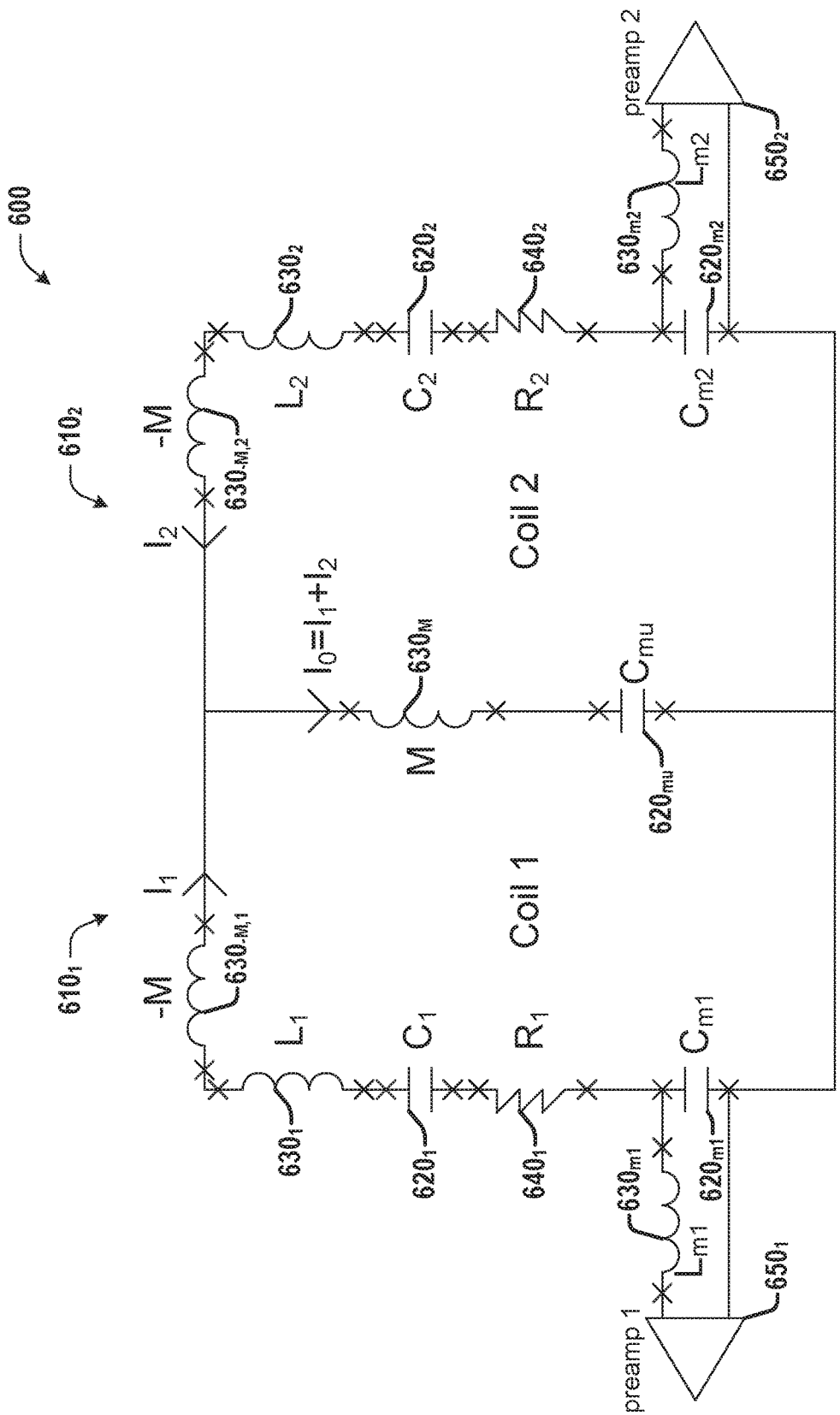
FIG. 6 is a diagram illustrating an equivalent circuit diagram showing decoupling of two coils via a capacitor, in connection with various aspects discussed herein.

Referring to FIG. 6, illustrated is an equivalent circuit diagram 600 showing decoupling of two coils $610_1$ and $610_2$ via a capacitor $620_{mu}$, in connection with various aspects discussed herein. As can be seen in FIG. 6 from the arrangement of inductor 630M (representing the mutual inductance M) and capacitor $620_{mu}$ (with capacitance $C_{mu}$), if $$j\omega M - j\frac{1}{\omega C_{mu}} = 0,$$

then coil $610_1$ (coil 1) and coil $610_2$ (coil 2) will perfectly decouple each other and $$\sqrt{R_1 + \left(\omega M - \frac{1}{\omega C_{mu}}\right)^2 / Rpre_2} = \sqrt{R_1},$$

such that coil $610_1$ only sees its own noise (and similarly for coil $610_2$). However, it should be noted that even when $$j\omega M - j\frac{1}{\omega C_{mu}} \neq 0,$$

the transferred resistance from coil $610_2$ can still be reduced (potentially significantly) as long as $$\left(\omega M - \frac{1}{\omega C_{mu}}\right)^2 < (\omega M)^2.$$

This is discussed in greater detail below in connection with decoupling rings employed by various embodiments to reduce overall coupling between coil elements.

Figure 7:
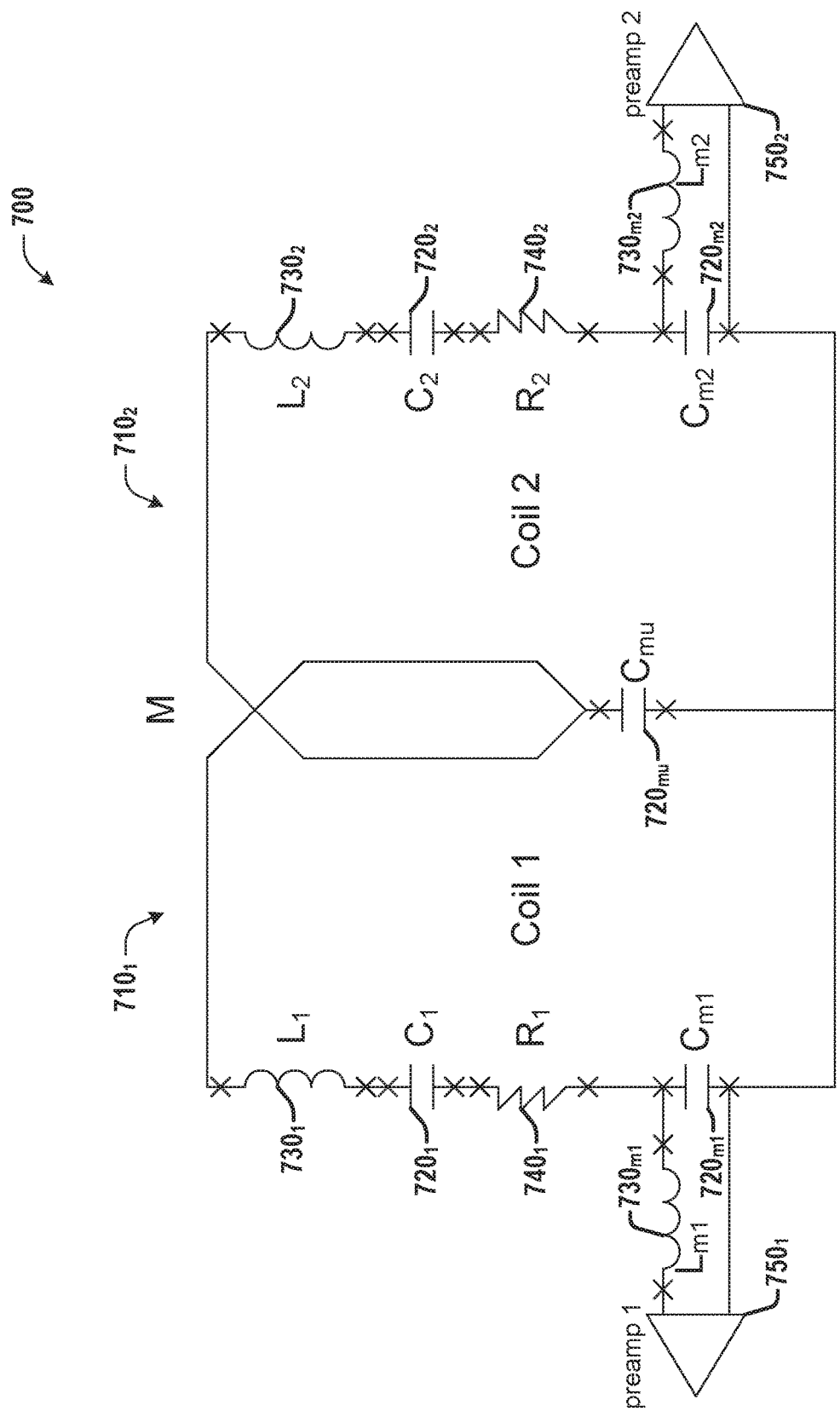
FIG. 7 is a diagram illustrating an example circuit diagram showing two directly neighboring coil elements decoupled via a shared capacitor, in connection with various aspects discussed herein.

Circuit diagram 600 of FIG. 6 illustrates how capacitor decoupling works. Depending on the physical locations of the two coils, for example, whether they are direct neighbors or non-direct neighbors, the application of FIG. 6 is different. Referring to FIG. 7, illustrated is an example circuit diagram 700 showing two directly neighboring coil elements 710$_1$ and 710$_2$ decoupled via a shared capacitor 720$_{mu}$, in connection with various aspects discussed herein. Although FIG. 7 shows coil elements 710$_1$ and 710$_2$ with a specific partial overlap which might (or might not) be an optimal overlap to minimize coupling, in various scenarios, the two coil elements can be over-overlapped or under-overlapped. Regardless of the overlap condition, however, a properly selected $C_{mu}$ value for capacitor 720$_{mu}$ can always decouple the two coil elements 710$_1$ and 710$_2$. If $C_{mu}$ has opposite sign from a capacitor, an inductor with the appropriate inductance can be employed in place of capacitor 720$_{mu}$.

Figure 8:
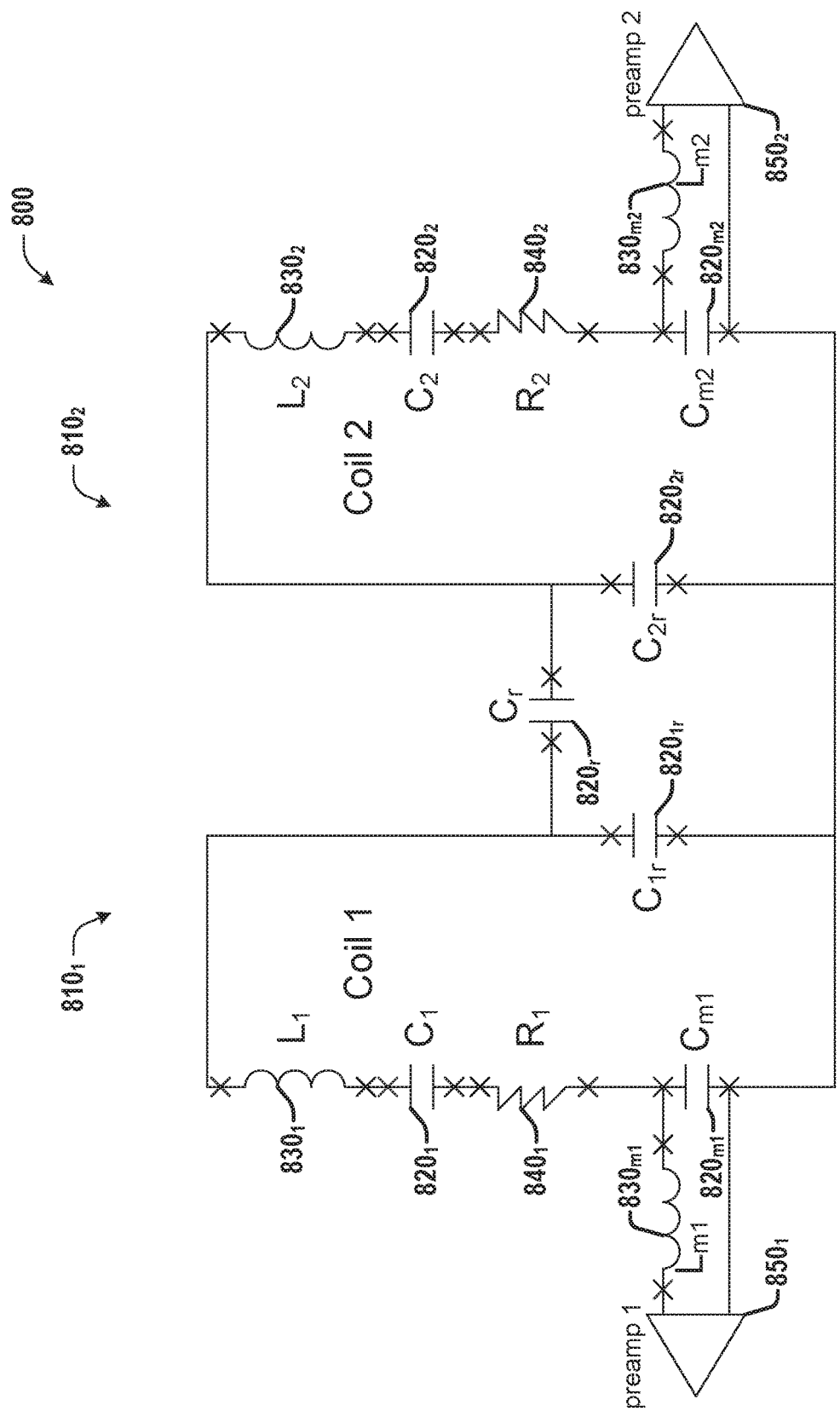
FIG. 8 is a diagram illustrating an example circuit diagram showing decoupling of two non-neighboring coil elements using a ring capacitor, according to various aspects discussed herein.

In various embodiments, however, capacitor decoupling can also be employed for coils that are not direct neighbors. Referring to FIG. 8, illustrated is an example circuit diagram 800 showing decoupling of two non-neighboring coil elements 810$_1$ and 810$_2$ using a ring capacitor 820$_r$, according to various aspects discussed herein. In FIG. 8, ring capacitor 820$_r$ (with capacitance $C_r$) and a short can be used to connect together capacitor 820$_{1r}$ (with capacitance $C_{1r}$) of coil 1 (810$_1$) and capacitor 820$_{1r}$ (with capacitance $C_{1r}$) of coil 1 (810$_1$). capacitor 820$_r$ is referred to herein as a ring capacitor, because capacitor 820$_r$, capacitor 820$_{1r}$, the short, and capacitor 820$_{2r}$ create a ring. There may be some inductance in this ring. For ease of discussion, this inductance is assumed to be zero, but this assumption does not affect the conclusion. Additionally, although coil elements 810$_1$ and 810$_2$ are non-neighboring coil elements, the same technique can be applied for neighboring coil elements. Using the approach discussed above, the transferred noise or resistance from coil 2 (810$_2$) to coil 1 (810$_1$) can be calculated, and the transferred resistance in FIG. 8 is where $Z_c = 1/\omega C$.

$$\left(\omega M - \frac{Z_{c1} * Z_{c2}}{Z_{c1} + Z_{c2} + Z_{cr}}\right)^2 / Rpre_2,$$

Figure 9:
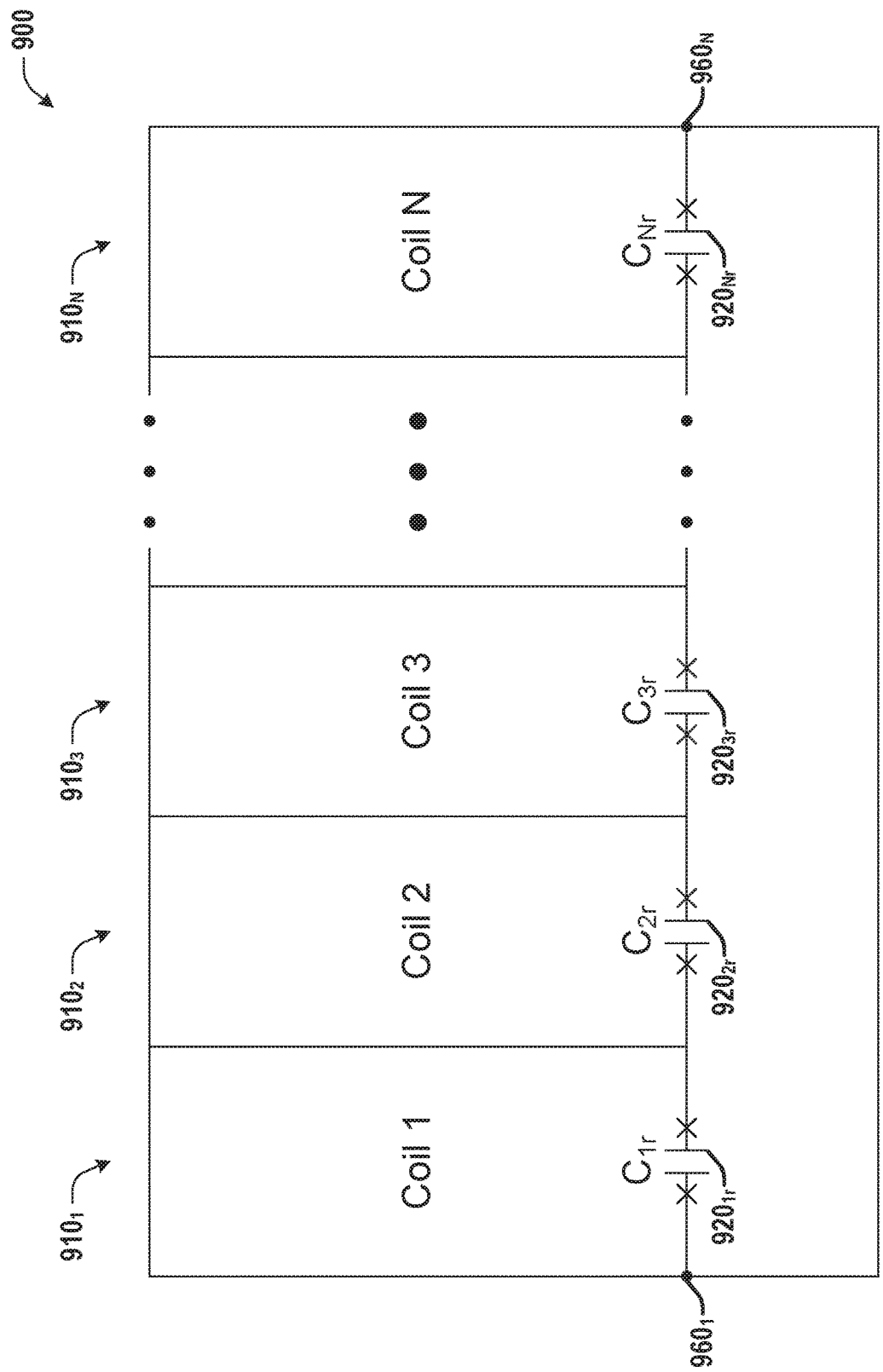
FIG. 9 is a diagram illustrating an example circuit diagram showing N coupled coil elements which share a decoupling ring comprising ring capacitors, according to various embodiments discussed herein.

In various embodiments, a ring capacitor such as 820$_r$ (with capacitance $C_r$) can comprise not just one capacitor, but can instead comprise multiple capacitors in series, and each one of them can be located within the loop of an associated coil element, similarly to capacitors 820$_{1r}$ (with capacitance $C_{1r}$) within the loop of associated coil element 810$_1$ or 820$_{2r}$ (with capacitance $C_{2r}$) within the loop of associated coil element 810$_2$. Referring to FIG. 9, illustrated is an example circuit diagram 900 showing N coupled coil elements 910$_1$-910$_N$ which share a decoupling ring comprising ring capacitors 920$_{ir}$, according to various embodiments discussed herein. In circuit diagram 900, coil 1 (910$_1$) is electrically connected to coil N (910$_N$) to form a ring comprising ring capacitors 920$_{ir}$ and the short between nodes 960$_1$ and 960$_N$. In various embodiments, N can be any integer greater than 1, including scenarios (e.g., N>3) wherein a given coil element has both direct neighbors and non-neighbors among other coil elements. In circuit diagram 900, the transfer resistance $R_{ik}$ seen by coil i from coil k can be written as in equation (4):

$$R_{ik} = \left(\omega M_{ik} - \frac{Z_{ci} * Z_{ck}}{\sum_m Z_{Cm}}\right)^2 / Rpre_k \quad (4)$$

The total transferred resistance seen by coil i is as in equation (5):

$$R_i = \sum_{\substack{k=1 \\ k \neq i}}^{N} \left(\omega M_{ik} - \frac{Z_{ci} * Z_{ck}}{\sum_m Z_{Cm}}\right)^2 / Rpre_k \quad (5)$$

Various embodiments can minimize $R_i$, which can reduce coil noise and increase overall coil SNR. Notably, in FIG. 9, coil elements 910$_1$-910$_N$ are coupled to each other non-trivially. If a coil element is not really coupled to the other coil elements of the ring, it can be potentially advantageous to omit that coil element from the ring.

As mentioned above, it is not necessary to make $R_i$ zero for perfect decoupling. By selecting appropriate $Z_{ci}$, $R_i$ can be reduced significantly, achieving substantial SNR improvement. In a general scenario, equation (5) is complicated. However, equation (5) can be simplified for minimization if additional symmetry is introduced.

As one example, consider an embodiment wherein the coil geometry is a cylinder and there are two equal length overlapped rows, wherein each row has an equal number (e.g., N) of the same size coil elements. In such an example embodiment, each coil element will see the same transferred resistance from all its neighbors, such that all of the $R_i$ are the same, regardless of the value of i. Notably, for this configuration, each coil element couples non-trivially to its non-direct neighbors both in the same row and the adjacent rows. Applying the additional symmetries of this example embodiment, equation (5) can be re-written as equation (6):

$$R = R_1 = \sum_{k=2}^{N} \left(\omega M_{1k} - \frac{Z_{c1} * Z_{ck}}{\sum_m Z_{Cm}}\right)^2 / Rpre \quad (6)$$

For equation (6), setting $Z_{Ci} = \sum_{k=2}^{N} \omega M_{1k} = (N-1)\omega \overline{M}$ for all i, then equation (6) becomes equation (7):

$$R = \sum_{k=2}^{N} (\omega M_{1k} - \omega \overline{M})^2 / Rpre = \sum_{k=2}^{N} (\omega M_{1k})^2 / Rpre - \sum_{k=2}^{N} (\omega \overline{M})^2 / Rpre \quad (7)$$

The R value in equation (7) is always smaller than the R value if a ring is not used, which is $R = \sum_{k=2}^{N} (j\omega M_{1k})^2 / Rpre$. If $\overline{M}$ deviates significantly from zero, then substantial reduction of transferred resistance can be achieved via a decoupling ring according to various embodiments discussed herein. For the example embodiment comprising two equal cylindrical rows, most couplings among non-direct neighbors in the same row or non-same row are considered under-overlapped. As a result, $\overline{M}$ is significantly away from zero. Accordingly, various embodiments can comprise a decoupling ring as discussed herein, which can readily minimize coupling among all non-direct neighbors in the same row and adjacent row(s), in contrast to existing techniques. If the coil has more than two rows, the couplings between non-adjacent rows are normally small and can be ignored. As a result, overall coil loss can be minimized (and thus SNR improved) just by addressing couplings within the same row or between adjacent rows.

Figure 10:
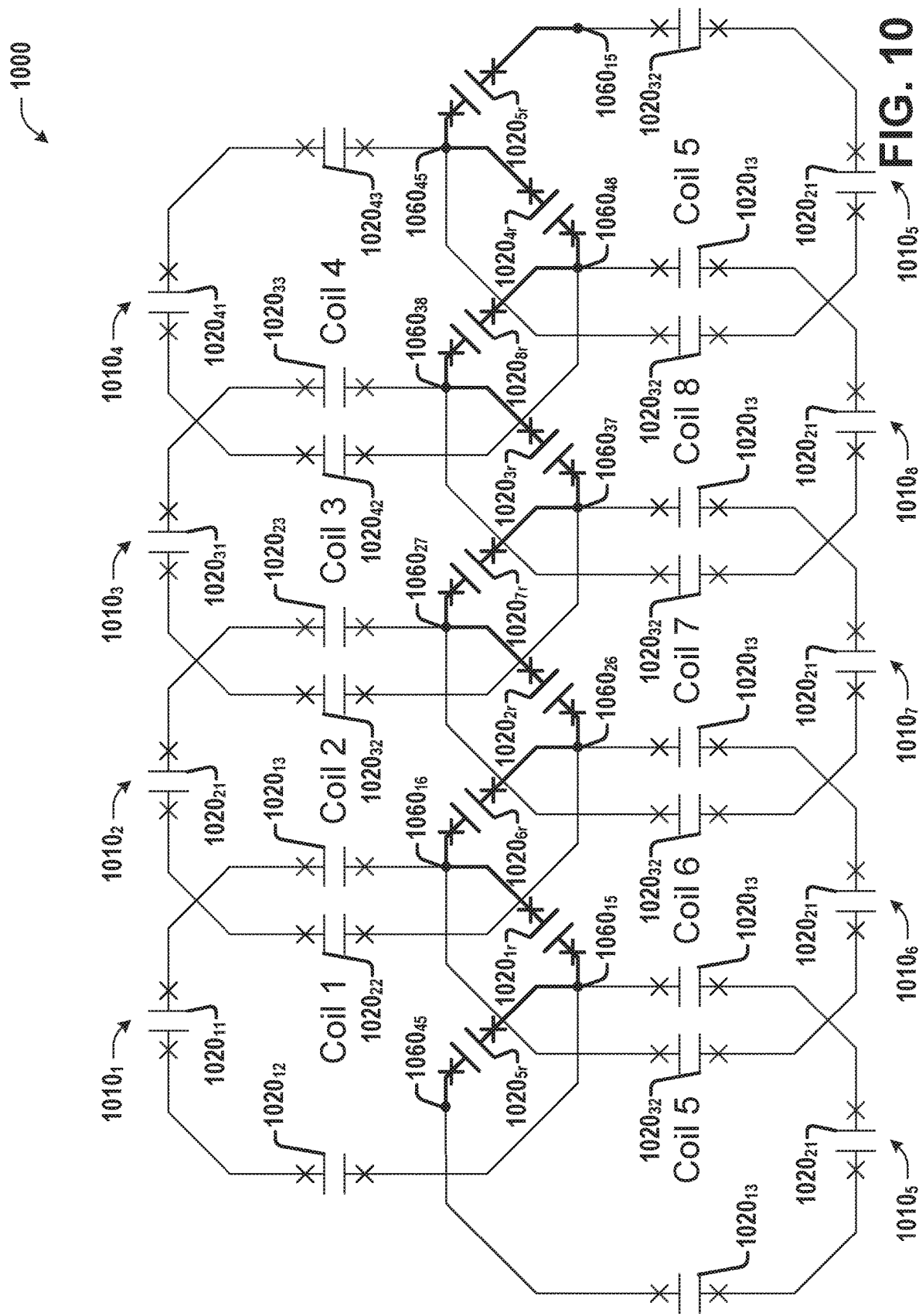
FIG. 10 is a diagram illustrating an example circuit diagram of a cylindrical coil array comprising a decoupling ring of capacitors, according to various embodiments discussed herein.

Various embodiments can employ a decoupling ring as described herein to cover two adjacent rows around a cylindrical former. Referring to FIG. 10, illustrated is an example circuit diagram of a cylindrical coil array 1000 comprising a decoupling ring of capacitors 1020$_{ir}$, according to various embodiments discussed herein. In coil array 1000, each of the ring capacitors $1020_{i,r}$ can be on a ring (indicated via the thicker line connecting ring capacitors $1020_{i,r}$ and nodes $1060_{i,j}$) common to each of the coil elements $1010_i$, wherein the ring can be formed by electrically connecting each coil element i to the two adjacent coil elements j in the other row from coil element i (e.g., $1010_1$ is adjacent to $1010_5$ and $1010_6$ in FIG. 10, etc.), at the nodes $1060_{i,j}$ indicated in FIG. 10. As one specific example, for coil element $1010_1$, nodes $1060_{15}$ and $1060_{16}$ electrically connect coil element $1010_1$ in the upper row to adjacent coil elements $1010_5$ and $1010_6$ in the lower row, respectively, wherein ring capacitor $1020_{i,r}$ is arranged on the decoupling ring between nodes $1060_{15}$ and $1060_{16}$. FIG. 10 also shows additional (e.g., break point) capacitors $1010_{i1}$-$1010_{i3}$, but for ease of illustration omits circuit elements that can be included (e.g., Tx and/or Rx circuitry, including preamplifiers, etc.). In FIG. 10, coil element $1010_5$, ring capacitor $1020_{5,r}$, and nodes $1060_{45}$ and $1060_{15}$ are shown at both the left and right, indicating the cylindrical nature of coil array 1000.

Additionally, for ease of illustration, FIG. 10 shows one specific embodiment comprising a first row of 4 coil elements $1010_1$-$1010_4$ and an adjacent second row of 4 coil elements $1010_5$-$1010_8$. However, various embodiments can comprise any of a variety of other combinations of elements between rows. For example, various embodiments can include combinations wherein the number of coil elements in each row is the same, such as any combination of N+N coil elements (for N any integer greater than 1) in the top row and bottom row, respectively. Additionally, however, various embodiments can include combinations wherein the number of coil elements in different rows are different, such as various combination of N+(N+1) (or vice versa) like 5+6 (or 6+5), etc. In embodiments with an equal number of coil elements in two adjacent rows, the decoupling ring can be formed substantially as shown in FIG. 10 with nodes $1060_B$ and alternating ring capacitors $1020_{i,r}$ of the top row and bottom row. In embodiments with an unequal number of coil elements in adjacent rows (e.g., which can be a different embodiment or a different pair of rows of the same embodiment), a different pattern can be employed for the decoupling ring, which will still comprise at least one ring capacitor of each coil element in a single electrically connected loop of the decoupling ring. Additionally, various embodiments can employ a decoupling ring as discussed herein in combination with one or other decoupling techniques for direct neighbors, such as overlap and/or capacitor decoupling, which can further minimize coupling for better SNR.

As additional examples, various embodiments can comprise M rows of coil elements, wherein adjacent rows can have the same or a different number of coil elements, and wherein decoupling ring(s) of ring capacitors can connect coil elements of at least two adjacent rows (e.g., between one pair of adjacent rows, between all pairs of adjacent rows, etc.) of the M rows (or of the single row, as in FIG. 9, if M is 1) to minimize coupling between coil elements in the same row and between the adjacent row(s), thereby improving SNR. Each of the coil elements to be in a given decoupling ring can comprise a ring capacitor for that decoupling ring with a capacitance selected to reduce or minimize coupling among the coil elements of that decoupling ring. The decoupling ring can be formed by electrically connecting into a single ring, for each coil element, a portion of that coil element that comprises its ring capacitor for that decoupling ring (e.g., a coil element of a row adjacent to two other rows can potentially be associated with two different decoupling rings, etc.). Additionally, neighboring coil elements can be further decoupled via one or more other techniques, such as overlap or shared capacitor(s), etc.

Examples herein can include subject matter such as a method, means for performing acts or blocks of the method, at least one machine-readable medium including executable instructions that, when performed by a machine (e.g., MRI machine, for example as described herein, etc.) cause the machine to perform acts of the method or of an apparatus or system according to embodiments and examples described.

A first example embodiment comprises a magnetic resonance imaging (MRI) radio frequency (RF) coil array on a cylindrical former that is configured to operate in a transmit (Tx) mode or in a receive (Rx) mode, the MRI RF coil array comprising: at least two rows along a cylindrical axis direction, where each row has at least three array coil elements cover the whole circumference, where two adjacent rows have overlaps and share a common decoupling ring as shown in FIG. 10, and where each coil section in that ring has a capacitor for coupling minimization among all elements in the two adjacent rows.

A second example embodiment comprises the first example embodiment, wherein the ring capacitor in each coil section is chosen so that its value is close to the mean value defined in equation (7).

A third example embodiment comprises the first example embodiment, wherein the cylindrical former is for one or more of a head, knee, leg, or wrist anatomy.

A fourth example embodiment comprises the first example embodiment, wherein the adjacent elements also use either overlap or capacitor decoupling to minimize the adjacent elements coupling.

A fifth example embodiment comprises the first example embodiment, wherein the two adjacent rows have one of an equal number of elements or an unequal number of elements.

The following examples are additional embodiments.

Example 1 is a magnetic resonance imaging (MRI) radio frequency (RF) coil array configured to operate in at least one of a transmit (Tx) mode or a receive (Rx) mode on a cylindrical former, the MRI RF coil array comprising: two or more rows of RF coil elements, wherein each row of the two or more rows of coil elements comprises at least three RF coil elements of that row that circumferentially enclose a cylindrical axis; and a ring comprising an associated portion of each RF coil element of the at least three RF coil elements of a first row of the two or more rows and of each RF coil element of the at least three RF coil elements of a second of the two or more rows, row electrically connected together, wherein the associated portion of each RF coil element of the first row and of each RF coil element of the second row comprises an associated capacitor of that RF coil element, and wherein the associated capacitor of that RF coil element is configured to reduce coupling among the at least three RF coil elements of the first row and the at least three RF coil elements of the second row.

Example 2 comprises the subject matter of any variation of any of example(s) 1, wherein the first row is longitudinally offset from the second row along the cylindrical axis, and wherein each RF coil element of the at least three RF coil elements of the first row has a partial overlap with one or more RF coil elements of the at least three RF coil elements of the second row.

Example 3 comprises the subject matter of any variation of any of example(s) 1-2, wherein, for each RF coil element of the first row and each RF coil element of the second row, the associated capacitor of that RF coil element has an impedance of $(N-1)\omega\overline{M}$, wherein N is equal to the total number of coil elements in the first row and the second row, $\omega$ is a working frequency of the MRI RF coil array, and $\overline{M}$ is an average of mutual inductances between each of the RF coil elements of the first row and the second row.

Example 4 comprises the subject matter of any variation of any of example(s) 1-3, wherein the cylindrical axis is the cylindrical axis of the cylindrical former, and wherein the cylindrical former is associated with one or more of a head anatomy, a knee anatomy, a leg anatomy, or a wrist anatomy.

Example 5 comprises the subject matter of any variation of any of example(s) 1-4, wherein each RF coil element of the first row has a partial overlap with two neighboring RF coil elements of the three or more RF coil elements of the first row, and wherein each RF coil element of the second row has a partial overlap with two neighboring RF coil elements of the three or more RF coil elements of the second row.

Example 6 comprises the subject matter of any variation of any of example(s) 1-5, wherein each RF coil element of the first row and each RF coil element of the second row comprises a first shared capacitor of that RF coil element that is also comprised within a first neighboring RF coil element in the same row as that RF coil element of the first row or the second row, and wherein each RF coil element of the first row and each RF coil element of the second row comprises a second shared capacitor of that RF coil element that is also comprised within a second neighboring RF coil element in the same row as that RF coil element of the first row or the second row.

Example 7 comprises the subject matter of any variation of any of example(s) 1-6, wherein the at least three RF coil elements of the first row is N RF coil elements, wherein the at least three RF coil elements of the second row is N RF coil elements, and wherein N is an integer greater than two.

Example 8 comprises the subject matter of any variation of any of example(s) 1-6, wherein the at least three RF coil elements of the first row is N RF coil elements, wherein the at least three RF coil elements of the second row is M RF coil elements, wherein N and M are integers greater than two, and wherein M is different than N.

Example 9 is a magnetic resonance imaging (MRI) system, comprising: a MRI radio frequency (RF) coil array configured to operate in at least one of a transmit (Tx) mode or a receive (Rx) mode on a cylindrical former, the MRI RF coil array comprising: two or more rows of RF coil elements, wherein each row of the two or more rows of coil elements comprises at least three RF coil elements of that row that circumferentially enclose a cylindrical axis; and a ring comprising an associated portion of each RF coil element of the at least three RF coil elements of a first row of the two or more rows and of each RF coil element of the at least three RF coil elements of a second of the two or more rows, row electrically connected together, wherein the associated portion of each RF coil element of the first row and of each RF coil element of the second row comprises an associated capacitor of that RF coil element, and wherein the associated capacitor of that RF coil element is configured to reduce coupling among the at least three RF coil elements of the first row and the at least three RF coil elements of the second row.

Example 10 comprises the subject matter of any variation of any of example(s) 9, wherein the first row is longitudinally offset from the second row along the cylindrical axis, and wherein each RF coil element of the at least three RF coil elements of the first row has a partial overlap with one or more RF coil elements of the at least three RF coil elements of the second row.

Example 11 comprises the subject matter of any variation of any of example(s) 9-10, wherein, for each RF coil element of the first row and each RF coil element of the second row, the associated capacitor of that RF coil element has an impedance of $(N-1)\omega\overline{M}$, wherein N is equal to the total number of coil elements in the first row and the second row, $\omega$ is a working frequency of the MRI RF coil array, and $\overline{M}$ is an average of mutual inductances between each of the RF coil elements of the first row and the second row.

Example 12 comprises the subject matter of any variation of any of example(s) 9-11, wherein the cylindrical axis is the cylindrical axis of the cylindrical former, and wherein the cylindrical former is associated with one or more of a head anatomy, a knee anatomy, a leg anatomy, or a wrist anatomy.

Example 13 comprises the subject matter of any variation of any of example(s) 9-12, wherein each RF coil element of the first row has a partial overlap with two neighboring RF coil elements of the three or more RF coil elements of the first row, and wherein each RF coil element of the second row has a partial overlap with two neighboring RF coil elements of the three or more RF coil elements of the second row.

Example 14 comprises the subject matter of any variation of any of example(s) 9-13, wherein each RF coil element of the first row and each RF coil element of the second row comprises a first shared capacitor of that RF coil element that is also comprised within a first neighboring RF coil element in the same row as that RF coil element of the first row or the second row, and wherein each RF coil element of the first row and each RF coil element of the second row comprises a second shared capacitor of that RF coil element that is also comprised within a second neighboring RF coil element in the same row as that RF coil element of the first row or the second row.

Example 15 comprises the subject matter of any variation of any of example(s) 9-14, wherein the at least three RF coil elements of the first row is N RF coil elements, wherein the at least three RF coil elements of the second row is N RF coil elements, and wherein N is an integer greater than two.

Example 16 comprises the subject matter of any variation of any of example(s) 9-14, wherein the at least three RF coil elements of the first row is N RF coil elements, wherein the at least three RF coil elements of the second row is M RF coil elements, wherein N and M are integers greater than two, and wherein M is different than N.

Example 17 is a magnetic resonance imaging (MRI) radio frequency (RF) coil array configured to operate in at least one of a transmit (Tx) mode or a receive (Rx) mode on a cylindrical former, the MRI RF coil array comprising: a first row comprising three or more RF coil elements of the first row, wherein the three or more RF coil elements of the first row circumferentially enclose a cylindrical axis; and a second row comprising three or more RF coil elements of the second row, wherein the three or more RF coil elements of the second row circumferentially enclose a cylindrical axis, wherein an associated portion of each RF coil element of the first row and each RF coil element of the second row is electrically connected together to form a ring, and wherein, for each RF coil element, the associated portion of that RF coil element comprises a ring capacitor of that RF coil element configured to reduce coupling among the three or more RF coil elements of the first row and the three or more RF coil elements of the second row.

Example 18 comprises the subject matter of any variation of any of example(s) 17, wherein the first row is longitudinally offset from the second row along the cylindrical axis, and wherein each RF coil element of the three or more RF coil elements of the first row has a partial overlap with one or more RF coil elements of the three or more RF coil elements of the second row.

Example 19 comprises the subject matter of any variation of any of example(s) 17-18, wherein, for each RF coil element of the first row and each RF coil element of the second row, the associated capacitor of that RF coil element has an impedance of $(N-1)\omega M$, wherein N is equal to the total number of coil elements in the first row and the second row, $\omega$ is a working frequency of the MRI RF coil array, and $\overline{M}$ is an average of mutual inductances between each of the RF coil elements of the first row and the second row.

Example 20 comprises the subject matter of any variation of any of example(s) 17-19, wherein the cylindrical axis is the cylindrical axis of the cylindrical former, and wherein the cylindrical former is associated with one or more of a head anatomy, a knee anatomy, a leg anatomy, or a wrist anatomy.

Example 21 is a MRI apparatus comprising a MRI RF coil according to any variation of any of example(s) 1-20.

Circuits, apparatus, elements, MRI RF coils, arrays, methods, and other embodiments described herein are described with reference to the drawings in which like reference numerals are used to refer to like elements throughout, and where the illustrated structures are not necessarily drawn to scale. Embodiments are to cover all modifications, equivalents, and alternatives falling within the scope of the disclosure and appended claims. In the figures, the thicknesses of lines, layers and/or regions may be exaggerated for clarity. Nothing in this detailed description (or drawings included herewith) is admitted as prior art.

Like numbers refer to like or similar elements throughout the description of the figures. When an element is referred to as being "connected" to another element, it can be directly connected to the other element or intervening elements may be present. In contrast, when an element is referred to as being "directly connected" to another element, there are no intervening elements present. Other words used to describe the relationship between elements should be interpreted in a like fashion (e.g., "between" versus "directly between," "adjacent" versus "directly adjacent," etc.).

In the above description some components may be displayed in multiple figures carrying the same reference signs, but may not be described multiple times in detail. A detailed description of a component may then apply to that component for all its occurrences.

The following includes definitions of selected terms employed herein. The definitions include various examples or forms of components that fall within the scope of a term and that may be used for implementation. The examples are not intended to be limiting. Both singular and plural forms of terms may be within the definitions.

References to "one embodiment", "an embodiment", "various embodiments," "one example", "an example", or "various examples" indicate that the embodiment(s) or example(s) so described may include a particular feature, structure, characteristic, property, element, or limitation, but that not every embodiment or example necessarily includes that particular feature, structure, characteristic, property, element or limitation. Furthermore, repeated use of the phrases "in one embodiment" or "in various embodiments" does not necessarily refer to the same embodiment(s), though it may.

"Circuit", as used herein, includes but is not limited to hardware, firmware, or combinations of each to perform a function(s) or an action(s), or to cause a function or action from another circuit, logic, method, or system. A circuit can include a software controlled microprocessor, a discrete logic (e.g., ASIC), an analog circuit, a digital circuit, a programmed logic device, a memory device containing instructions, and other physical devices. A circuit can include one or more gates, combinations of gates, or other circuit components. Where multiple logical circuits are described, it may be possible to incorporate the multiple logical circuits into one physical circuit. Similarly, where a single logical circuit is described, it may be possible to distribute that single logical circuit between multiple physical circuits.

"Computer-readable storage device", as used herein, refers to a device that stores instructions or data. "Computer-readable storage device" does not refer to propagated signals. A computer-readable storage device can take forms, including, but not limited to, non-volatile media, and volatile media. Non-volatile media can include, for example, optical disks, magnetic disks, tapes, and other media. Volatile media can include, for example, semiconductor memories, dynamic memory, and other media. Common forms of a computer-readable storage device can include, but are not limited to, a floppy disk, a flexible disk, a hard disk, a magnetic tape, other magnetic medium, an application specific integrated circuit (ASIC), a compact disk (CD), other optical medium, a random access memory (RAM), a read only memory (ROM), a memory chip or card, a memory stick, and other media from which a computer, a processor or other electronic device can read.

To the extent that the term "includes" or "including" is employed in the detailed description or the claims, it is intended to be inclusive in a manner similar to the term "comprising" as that term is interpreted when employed as a transitional word in a claim.

To the extent that the term "or" is employed in the detailed description or claims (e.g., A or B) it is intended to mean "A or B or both". The term "and/or" is used in the same manner, meaning "A or B or both". When the applicants intend to indicate "only A or B but not both" then the term "only A or B but not both" will be employed. Thus, use of the term "or" herein is the inclusive, and not the exclusive use. See, Bryan A. Garner, A Dictionary of Modern Legal Usage 624 (2d. Ed. 1995).

To the extent that the phrase "one or more of, A, B, and C" is employed herein, (e.g., a data store configured to store one or more of, A, B, and C) it is intended to convey the set of possibilities A, B, C, AB, AC, BC, and/or ABC (e.g., the data store can store only A, only B, only C, A&B, A&C, B&C, and/or A&B&C). It is not intended to require one of A, one of B, and one of C. When the applicants intend to indicate "at least one of A, at least one of B, and at least one of C", then the phrasing "at least one of A, at least one of B, and at least one of C" will be employed.

A set of elements or a set of other components can be described herein, in which the term "set" can be interpreted as "one or more," unless the context indicates otherwise (e.g., "the empty set," "a set of two or more Xs," etc.).

Additionally, in situations wherein one or more numbered items are discussed (e.g., a "first X", a "second X", etc.), in general the one or more numbered items can be distinct or they can be the same, although in some situations the context may indicate that they are distinct or that they are the same.

Although the subject matter has been described in language specific to structural features or methodological acts, it is to be understood that the subject matter defined in the appended claims is not necessarily limited to the specific features or acts described above. Rather, the specific features and acts described above are disclosed as example forms of implementing the claims.

The above description of illustrated embodiments of the subject disclosure, including what is described in the Abstract, is not intended to be exhaustive or to limit the disclosed embodiments to the precise forms disclosed. While specific embodiments and examples are described herein for illustrative purposes, various modifications are possible that are considered within the scope of such embodiments and examples, as those skilled in the relevant art can recognize.

In this regard, while the disclosed subject matter has been described in connection with various embodiments and corresponding Figures, where applicable, it is to be understood that other similar embodiments can be used or modifications and additions can be made to the described embodiments for performing the same, similar, alternative, or substitute function of the disclosed subject matter without deviating therefrom. Therefore, the disclosed subject matter should not be limited to any single embodiment described herein, but rather should be construed in breadth and scope in accordance with the appended claims below.

In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations. In addition, while a particular feature may have been disclosed with respect to only one of several implementations, such feature can be combined with one or more other features of the other implementations as may be desired and advantageous for any given or particular application.

What is claimed is:

1. A magnetic resonance imaging (MRI) radio frequency (RF) coil array configured to operate in at least one of a transmit (Tx) mode or a receive (Rx) mode on a cylindrical former, the MRI RF coil array comprising:
two or more rows of RF coil elements, wherein each row of the two or more rows of RF coil elements comprises at least three RF coil elements of that row that circumferentially enclose a cylindrical axis; and
a ring comprising an associated portion of each RF coil element of the at least three RF coil elements of a first row of the two or more rows and of each RF coil element of the at least three RF coil elements of a second row of the two or more rows electrically connected together,
wherein the associated portion of each RF coil element of the first row and of each RF coil element of the second row comprises an associated capacitor of that RF coil element,
wherein the associated capacitor of that RF coil element is configured to reduce coupling among the at least three RF coil elements of the first row and the at least three RF coil elements of the second row,
wherein the at least three RF coil elements of the first row is N RF coil elements, wherein the at least three RF coil elements of the second row is M RF coil elements, wherein N and M are integers greater than two, and wherein M is different than N.

2. The MRI RF coil array of claim 1, wherein the first row is longitudinally offset from the second row along the cylindrical axis, and wherein each RF coil element of the at least three RF coil elements of the first row has a partial overlap with one or more RF coil elements of the at least three RF coil elements of the second row.

3. The MRI RF coil array of claim 1, wherein, for each RF coil element of the first row and each RF coil element of the second row, the associated capacitor of that RF coil element has an impedance of $(N-1)\omega\overline{M}$, wherein N is equal to a total number of RF coil elements in the first row and the second row, $\omega$ is a working frequency of the MRI RF coil array, and $\overline{M}$ is an average of mutual inductances between each of the RF coil elements of the first row and the second row.

4. The MRI RF coil array of claim 1, wherein the cylindrical axis is a cylindrical axis of the cylindrical former, and wherein the cylindrical former is associated with one or more of a head anatomy, a knee anatomy, a leg anatomy, or a wrist anatomy.

5. The MRI RF coil array of claim 1, wherein each RF coil element of the first row has a partial overlap with two neighboring RF coil elements of the at least three RF coil elements of the first row, and wherein each RF coil element of the second row has a partial overlap with two neighboring RF coil elements of the at least three RF coil elements of the second row.

6. The MRI RF coil array of claim 1, wherein each RF coil element of the first row and each RF coil element of the second row comprises a first shared capacitor of that RF coil element that is also comprised within a first neighboring RF coil element in the same row as that RF coil element of the first row or the second row, and wherein each RF coil element of the first row and each RF coil element of the second row comprises a second shared capacitor of that RF coil element that is also comprised within a second neighboring RF coil element in the same row as that RF coil element of the first row or the second row.

7. A magnetic resonance imaging (MRI) system, comprising:
a MRI radio frequency (RF) coil array configured to operate in at least one of a transmit (Tx) mode or a receive (Rx) mode on a cylindrical former, the MRI RF coil array comprising:
two or more rows of RF coil elements, wherein each row of the two or more rows of RF coil elements comprises at least three RF coil elements of that row that circumferentially enclose a cylindrical axis; and
a ring comprising an associated portion of each RF coil element of the at least three RF coil elements of a first row of the two or more rows and of each RF coil element of the at least three RF coil elements of a second row of the two or more rows electrically connected together,
wherein the associated portion of each RF coil element of the first row and of each RF coil element of the second row comprises an associated capacitor of that RF coil element,
wherein the associated capacitor of that RF coil element is configured to reduce coupling among the at least three RF coil elements of the first row and the at least three RF coil elements of the second row;
wherein the first row is longitudinally offset from the second row along the cylindrical axis, and wherein each RF coil element of the at least three RF coil elements of the first row has a partial overlap with one or more RF coil elements of the at least three RF coil elements of the second row.

8. The MRI system of claim 7, wherein, for each RF coil element of the first row and each RF coil element of the second row, the associated capacitor of that RF coil element has an impedance of $(N-1)\omega\overline{M}$, wherein N is equal to a total number of RF coil elements in the first row and the second row, $\omega$ is a working frequency of the MRI RF coil array, and $\overline{M}$ is an average of mutual inductances between each of the RF coil elements of the first row and the second row.

9. The MRI system of claim 7, wherein each RF coil element of the first row has a partial overlap with two neighboring RF coil elements of the at least three RF coil elements of the first row, and wherein each RF coil element of the second row has a partial overlap with two neighboring RF coil elements of the at least three RF coil elements of the second row.

10. The MRI system of claim 7, wherein each RF coil element of the first row and each RF coil element of the second row comprises a first shared capacitor of that RF coil element that is also comprised within a first neighboring RF coil element in the same row as that RF coil element of the first row or the second row, and wherein each RF coil element of the first row and each RF coil element of the second row comprises a second shared capacitor of that RF coil element that is also comprised within a second neighboring RF coil element in the same row as that RF coil element of the first row or the second row.

11. The MRI system of claim 7, wherein the at least three RF coil elements of the first row is N RF coil elements, wherein the at least three RF coil elements of the second row is N RF coil elements, and wherein N is an integer greater than two.

12. The MRI system of claim 7, wherein the at least three RF coil elements of the first row is N RF coil elements, wherein the at least three RF coil elements of the second row is M RF coil elements, wherein N and M are integers greater than two, and wherein M is different than N.

13. A magnetic resonance imaging (MRI) radio frequency (RF) coil array configured to operate in at least one of a transmit (Tx) mode or a receive (Rx) mode on a cylindrical former, the MRI RF coil array comprising:
a first row comprising three or more RF coil elements of the first row, wherein the three or more RF coil elements of the first row circumferentially enclose a cylindrical axis; and
a second row comprising three or more RF coil elements of the second row, wherein the three or more RF coil elements of the second row circumferentially enclose the cylindrical axis,
wherein an associated portion of each RF coil element of the first row and each RF coil element of the second row is electrically connected together to form a ring,
wherein, for each RF coil element, the associated portion of that RF coil element comprises a ring capacitor of that RF coil element configured to reduce coupling among the three or more RF coil elements of the first row and the three or more RF coil elements of the second row,
wherein the three or more RF coil elements of the first row comprises a first RF coil element, wherein the three or more RF coil elements of the second row comprises a second RF coil element bordering the first RF coil element, and wherein the ring capacitor of the first RF coil element has a first terminal electrically shorted to a first terminal of the ring capacitor of the second RF coil element.

14. The MRI RF coil array of claim 13, wherein the first row is longitudinally offset from the second row along the cylindrical axis, and wherein each RF coil element of the three or more RF coil elements of the first row has a partial overlap with one or more RF coil elements of the three or more RF coil elements of the second row.

15. The MRI RF coil array of claim 13, wherein, for each RF coil element of the first row and each RF coil element of the second row, the ring capacitor of that RF coil element has an impedance of $(N-1)\omega\overline{M}$, wherein N is equal to a total number of RF coil elements in the first row and the second row, $\omega$ is a working frequency of the MRI RF coil array, and $\overline{M}$ is an average of mutual inductances between each of the RF coil elements of the first row and the second row.

16. The MRI RF coil array of claim 13, wherein the cylindrical axis is a cylindrical axis of the cylindrical former, and wherein the cylindrical former is associated with one or more of a head anatomy, a knee anatomy, a leg anatomy, or a wrist anatomy.

17. The MRI RF coil array of claim 13, wherein the three or more RF coil elements of the second row comprises a third RF coil element bordering the first and second RF coil elements, and wherein the associated portion of the first RF coil element is directly electrically coupled to the associated portion of the third RF coil element.

18. The MRI RF coil array of claim 13, wherein the three or more RF coil elements of the second row comprises a third RF coil element bordering the first and second RF coil elements, and wherein the ring capacitor of the first RF coil element has a second terminal electrically shorted to a first terminal of the ring capacitor of the third RF coil element.

19. The MRI RF coil array of claim 13, wherein the ring comprises a plurality of capacitors electrically shorted together terminal to terminal in a closed, ring-shaped path extending circumferentially around the cylindrical axis, and wherein the plurality of capacitors comprises the ring capacitor of each RF coil element of the first row and the ring capacitor of each RF coil element of the second row.

20. The MRI RF coil array of claim 19, wherein the ring alternates between a capacitor of the first row and a capacitor of the second row along the closed, ring-shaped path.

* * * * *